US012618995B2

(12) United States Patent
Zhong et al.

(10) Patent No.: US 12,618,995 B2
(45) Date of Patent: May 5, 2026

(54) FINITE ELEMENT-BASED ORE DEPOSIT DRILLING INFORMATION PROCESSING AND ANALYSIS METHOD AND DEVICE

(71) Applicant: Chengdu University of Technology, Chengdu City (CN)

(72) Inventors: Linglin Zhong, Chengdu City (CN); Kanghui Zhong, Chengdu City (CN); Qin Qin, Chengdu City (CN); Hongjie Zhang, Chengdu City (CN); Zhao Yan, Chengdu City (CN); Haozhen Huang, Chengdu City (CN); Yupeng Chang, Chengdu City (CN)

(73) Assignee: Chengdu University of Technology, Chengdu City (CN)

( * ) Notice: Subject to any disclaimer, the term of this patent is extended or adjusted under 35 U.S.C. 154(b) by 380 days.

(21) Appl. No.: 18/066,605

(22) Filed: Dec. 15, 2022

(65) Prior Publication Data

US 2023/0204810 A1     Jun. 29, 2023

(30) Foreign Application Priority Data

Dec. 23, 2021     (CN) .......................... 202111586366.8

(51) Int. Cl.
| | |
|---|---|
| *G01V 1/50* | (2006.01) |
| *G01V 1/46* | (2006.01) |
| *G06F 30/23* | (2020.01) |

(52) U.S. Cl.
CPC .................. *G01V 1/50* (2013.01); *G01V 1/46* (2013.01); *G06F 30/23* (2020.01)

(58) Field of Classification Search
CPC . G01V 1/50; G01V 1/46; G01V 20/00; G06F 30/23
See application file for complete search history.

(56) References Cited

FOREIGN PATENT DOCUMENTS

| | | | |
|---|---|---|---|
| CN | 105074125 B | * | 4/2018 |
| CN | 111247601 A | * | 6/2020 |
| CN | 113536535 A | * | 10/2021 |

OTHER PUBLICATIONS

Yu, Y. S., and et al. "Very large-scale 3-D modelling of mine structures using the finite element technique." In ARMA North America Rock Mechanics Symposium, pp. ARMA-96. ARMA, 1996 (Year: 1996).*

(Continued)

*Primary Examiner* — Douglas Kay
(74) *Attorney, Agent, or Firm* — Edell, Shapiro & Finnan, LLC

(57) ABSTRACT

A finite element-based ore deposit drilling information processing and analysis method and device are described herein. The information processing method includes: dividing finite elements based on related information of an exploration borehole, and constructing corresponding sectional finite element planes; and performing three-dimensional (3D) spatial co-position stacking on the sectional finite element planes, and constructing scanning analytic finite element profiles through spatial analysis. According to the method, geological borehole information can be visually analyzed and presented in a sectional and layered mode, and the method has excellent practical value and indicating significance for accurate delineation of prospecting target areas, accurate mining, dressing and smelting, and structural metallogenic research.

9 Claims, 5 Drawing Sheets

(56) References Cited

OTHER PUBLICATIONS

Xiong, Zhitao, and et al. "New algorithm for three-dimensional borehole-to-surface apparent resistivity imaging based on unstructured mesh finite-element method." IEEE Access 8 (2019): 184-194 (Year: 2019).*

* cited by examiner

FINITE ELEMENT-BASED ORE DEPOSIT DRILLING INFORMATION PROCESSING AND ANALYSIS METHOD AND DEVICE

CROSS REFERENCE TO RELATED APPLICATION

This patent application claims the benefit and priority of Chinese Patent Application No. 202111586366.8, filed with the China National Intellectual Property Administration on Dec. 23, 2021, the disclosure of which is incorporated by reference herein in its entirety as part of the present application.

TECHNICAL FIELD

The present disclosure relates to the technical field of ore deposit drilling information analysis methods.

BACKGROUND

How to interpret and present ore deposit exploration information and guide the exploration, development and comprehensive utilization of ore resources is an important research content of ore deposit science. Compared with the basic geological survey, geochemical exploration, geophysical exploration, remote sensing, and prospecting projects carried out on the surface and shallow underground, the exploration borehole information can directly and objectively reflect geological information such as underground lithology, occurrence, structure, construction, mineralization, alteration, hidden explosion and crushing within the borehole range, providing direct, real and reliable data support for geological exploration. In addition, in recent years, with the development of analysis technology, the element analysis data of drilling core have been enriched.

In the prior art, the drilling exploration data is processed and presented mainly through the geological profile and geochemical interpolation map of the exploration line, which usually follows the processing sequence of the single project borehole histogram, exploration line profile, and sectional plane. This method has the following obvious defects:

(1) During construction of geological/geochemical profiles of exploration lines, due to the subjectivity of manual linking and the distortion or over fitting of interpolation methods, they often deviate from the geological reality. (2) The boundaries of different types of geological and geochemical maps are quite different, so it is often difficult to carry out spatial comprehensive matching analysis, and only rough superposition analysis can be carried out. (3) Due to the lack of vertical constraint between the two boreholes, the commonly used processing sequence of the profile has congenital errors, and the errors generated in the profile drawing phase will further accumulate during drawing of the plane, resulting in distortion.

On the other hand, in recent years, researchers have gradually realized that the geological system, especially the system of magma, structure and fluid interaction, is an open, complex and fuzzy nonlinear system with self-organized criticality. In addition, endogenetic deposits, especially fluid related deposits, often form complex superposition of multiple systems from different geological historical periods. It is difficult to interpret it as a whole under the existing technical conditions. Both empirical inference and interpolation based on existing data are likely to be misleading.

SUMMARY

An objective of the present disclosure is to provide an improved ore deposit drilling information processing method and device, which can use computer technology to visually analyze and present sectional and layered geological borehole information. The processing method can solve the problem that it is difficult to perform comprehensive comparative analysis of multivariate geological information and geochemistry for the map results in the existing methods, and can further solve the problems of systematic errors caused by the lack of vertical constraints between boreholes, human factors having great influence on the delineation of geological body boundaries of exploration profiles, as well as the obvious interpolation distortion in the drawing of geochemical maps in the traditional method for obtaining the sectional plane through the exploration line profile.

Technical solutions of the present disclosure are as follows:

A finite element-based ore deposit drilling information processing method includes:

obtaining borehole information, sampled sample information, and geological information corresponding to a borehole of a to-be-analyzed ore deposit, where the sampled sample information includes position information and chemical analysis information of samples sampled through the borehole;

based on three standard values of an associated grade, a cut-off grade, and an industrial grade specified in an industrial standard of mineral geological exploration specifications, performing grade classification of ore deposits corresponding to the samples at different positions according to the sampled sample information;

according to the borehole information, the sampled sample information, and the geological information corresponding to the borehole, performing vertical section analysis of the to-be-analyzed ore deposit, where the analysis includes: determining a spacing and number of vertical sections, calculating mineralization, hidden explosion, and alteration parameters of each of the sections, and classifying the calculated parameters;

obtaining a horizonal plane projection map of exploration borehole control points in different vertical sections, and performing map zoning according to a control range of each exploration point to form a sectional finite element zoning map;

according to results of the vertical section analysis, assigning different parameters to each finite element in the sectional finite element zoning map of different vertical sections to form a sectional finite element plane of each parameter;

performing three-dimensional (3D) superposition on the sectional finite element plane of each parameter according to spatial positions, and during the superposition, combining parameters at a same position to obtain a 3D composite data graph; and scanning and analyzing the 3D composite data graph on a vertical profile to obtain a corresponding finite element profile containing composite data.

According to some implementations of the present disclosure, the borehole information includes position coordinates, an elevation, an azimuth angle, a dip angle and a depth of the borehole.

According to some implementations of the present disclosure, the sampled sample information includes starting position coordinates of sampling, ending position coordinates of sampling, and chemical analysis items and chemical analysis result data of the samples.

According to some implementations of the present disclosure, the geological information includes a name of rock and ore corresponding to the borehole, geological description, an alteration type, and a hidden explosion and crushing degree.

According to some implementations of the present disclosure, the grades include: grade A: greater than or equal to associated grade and less than cut-off grade; grade B: greater than or equal to cut-off grade and less than industrial grade; and grade C: greater than or equal to industrial grade.

According to some implementations of the present disclosure, the vertical section analysis specifically includes:

setting a vertical spacing of the section analysis;

according to the borehole information, obtaining an elevation H(max) of a maximum opening and an elevation H(min) of a minimum final hole of the borehole, and determining a number of the sections [N]+1 in combination with the vertical spacing 1, where [ ]represents rounding, and N is calculated as follows:

$$N = \frac{H(\max) - H(\min)}{\overline{H}};$$

and according to the geological information corresponding to the borehole, calculating a mineralization thickness percentage parameter, a thickness percentage parameter of a hidden explosion section, and a thickness percentage parameter of an altered section of the boreholes in each vertical section with different grades, and classifying the percentage parameters into several levels from high to low, where the percentage parameters are calculated as follows:

mineralization thickness percentage=(mineralization thickness in vertical section/thickness of sample section)×100%;

thickness percentage of hidden explosion section=(length of hidden explosion section in vertical section/thickness of sample section)×100%; and thickness percentage of altered section=(length of altered section in vertical section/thickness of sample section)×100%.

According to some implementations of the present disclosure, the vertical spacing $\overline{H}$ is 20-25 m.

According to some implementations of the present disclosure, the levels include the following five levels: 100-80% for level I, 80-50% for level II, 50-30% for level III, 30-10% for level IV, and 10-0% for level V.

According to some implementations of the present disclosure, a process of obtaining the sectional finite element zoning map specifically includes:

in any vertical section, projecting the exploration borehole control points on the plane;

performing finite extrapolation of outermost control points and connecting an envelope of an extrapolated circle to determine a boundary of the finite element zoning map;

according to a principle of adjacent points sharing a same edge, dividing a boundary line of the finite elements along a midpoint between adjacent projects, and dividing the finite elements accordingly to form the sectional finite element zoning map;

according to a regional geological structure, a degree of engineering deflection, and distribution of discontinuities, and in combination with a geological expert knowledge base, adjusting boundary division of the finite elements; and assigning the results of the vertical section analysis to each finite element class by class to form the sectional finite element plane of each parameter.

According to some implementations of the present disclosure, an extrapolated spacing is ½ of an average spacing of mining projects.

According to some implementations of the present disclosure, in the sectional finite element plane, data compositions at different points are as follows:

for any point $D_m$, if the point is located in the finite element, there is:

$D_m = \{X_m, Y_m, P, \alpha_p, \beta_p, \gamma_p \ldots \}$; and if the point is located on a boundary of the finite element, there is:

$D_m = \{X_m, Y_m, H_m, B\}$, where $X_m$ and $Y_m$ represent plane coordinates of the point, P represents the finite element that the point belongs to on the plane, $\alpha_p, \beta_p, \gamma_p$, represents various to-be-analyzed attributes to which the finite element is assigned, B represents a boundary point nature of the point, and $H_n$ represents an elevation of a section where the point is located.

According to some implementations of the present disclosure, a process of obtaining the finite element profile containing composite data specifically includes:

on each horizontal plane of the 3D composite data graph, arranging a parallel vertical profile with a horizontal spacing of $\overline{L}$ for zone line spatial discrimination analysis with the sectional finite element zoning map;

when the vertical profile intersects a sectional plane of the sectional finite element zoning map, assigning an intersection point according to the combination of the parameters at the same position;

based on boundary points assigned in the sectional finite element plane, dividing an intersection line of the vertical profile and the sectional plane, extending each boundary point on the intersection line by ½$\overline{L}$ upward or downward along the vertical profile, and performing horizontal sealing to create the finite elements on the profile; and based on attribute points on the intersection line assigned with {P, $\alpha_p, \beta_p, \gamma_p$), assigning the profile finite element, and constructing the analytic finite element profile and a corresponding database thereof.

According to the above information processing method, an analysis method can be further obtained, including:

performing superposition analysis on the sectional finite element plane and/or analytical profile of the parameters.

According to some implementations of the present disclosure, the analysis method further includes: determining a spatial correlation of multiple objects according to results of the superposition analysis, delineating a potential metallogenic prospect zone in combination with a development trend of a mineralization grade, a hidden explosion grade, and an alteration grade and a geological law, and predicting and evaluating a resource potential of surrounding and deep ore bodies of a mining area.

According to the above information processing method and/or analysis method, an ore deposit drilling information analysis device can be further obtained, including a storage medium and an arithmetic unit (ALU). The storage medium stores program and/or structural data for implementing any one of the above information processing methods and/or the analysis method. The present disclosure has the following beneficial effects:

Through the processing or analysis method of the present disclosure, a complete set of sectional planar projection analytic plane and hierarchical planar scanning analytic profile can be obtained, and the following can be realized:

(1) The geological and geochemical information of borehole exploration can be regularly processed to reduce the subjectivity of human interpretation and the distortion of interpolation analysis and more objectively and truly reflect underground stratum lithology, structure, mineralization, alteration, hidden explosion and crushing in the borehole range, and the maps presented are more consistent with the geological reality.

(2) By constructing the finite element only related to the spatial distribution of borehole control, and assigning the multivariate information to the finite element with standardized shape, it is convenient for geological and geochemical multidimensional analysis for the complex system with multi-phase superposition.

(3) Through the sectional finite element plane at different depths, spatial 3D co-position superposition, and scanning analytic finite element profile, and by making use of the more uniform distribution of the borehole control points on the plane than those on the profile, errors caused by the lack of vertical constraints between boreholes are reduced in the traditional interpretation method of the single project borehole histogram, exploration line profile, and sectional plane.

The present disclosure systematically solves the problems of few contents, single use, and poor metallogenic prediction effect of the current traditional geological borehole information expression method, which has excellent practical value and indicating significance for accurate delineation of prospecting target areas, accurate mining, dressing and smelting, and structural metallogenic research.

DETAILED DESCRIPTION

The present disclosure is described in detail below in combination with the embodiments and drawings, but it should be understood that the embodiments and drawings are only used to describe the present disclosure in an exemplary manner, and cannot constitute any limitation on the scope of protection of the present disclosure. All reasonable transformations and combinations included within the purpose of the present disclosure fall into the scope of protection of the present disclosure.

Some specific implementations of the present disclosure are described by taking the example of delineating favorable ore forming areas based on borehole mineralization, hidden explosion (blasting phenomena related to high-pressure fluid occurring in underground strata, usually related to fluid activity and mineralization) and alteration information.

Figure 1:
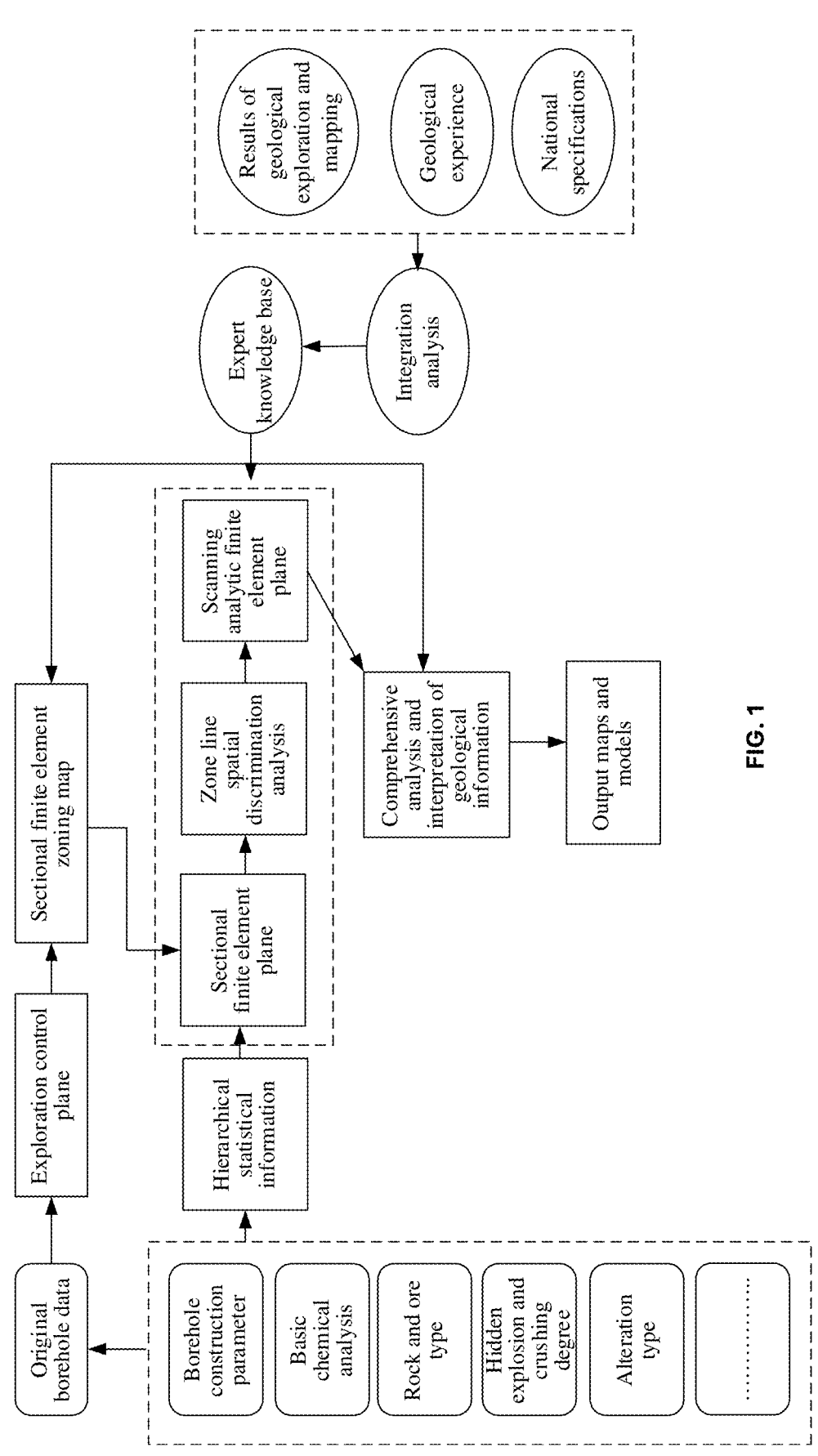
FIG. 1 is a flow diagram of a specific implementation of the present disclosure.
Figure 2:
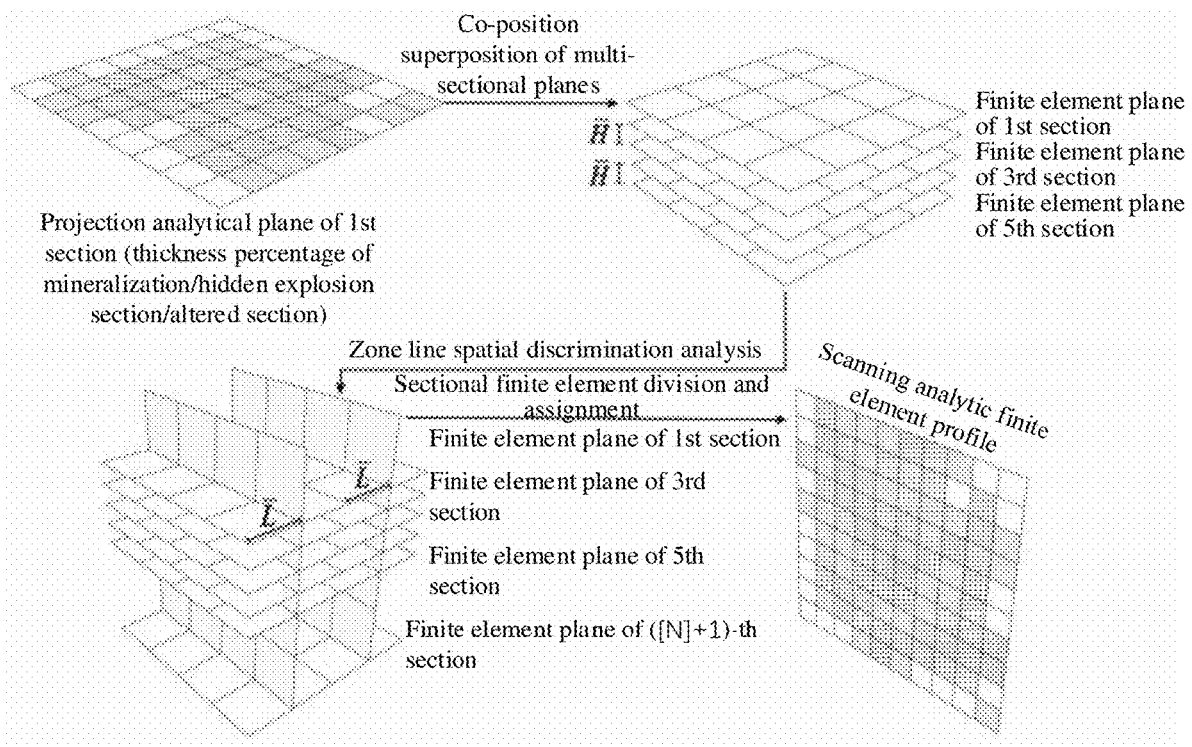
FIG. 2 is a flow diagram of scanning and analyzing a finite element profile in the specific implementation of the present disclosure.

Referring to the specification drawings FIG. 1 to FIG. 2, according to technical solutions of the present disclosure, a specific implementation process can include the following steps.

Step 1 Taking a geological work project or an ore deposit as a unit, map data, text data, and table data related to geological borehole data are comprehensively collected, and the collected geological borehole data is systematically checked and sorted out.

The collected data mainly includes: geological work report, engineering layout diagram, borehole sampling grade (basic) analysis data sheet, borehole engineering parameters (such as position parameters and inclinometer parameters), borehole histogram, and exploration line profile. The inspection may be as follows.

(1) Integrity check: whether the geological borehole coordinates are complete, whether the borehole data amount is sufficient, whether sections of the single project are continuous, and whether the borehole sampling analysis data is complete.

(2) Validity check: whether the basic chemical analysis data of the borehole has undetected and incorrect numerical data, and whether the logical relationship between the analysis data items is correct.

(3) Normative check: whether the name, geological description, alteration type and crushing data of rock and ore are standardized and scientific.

Step 2 After step 1, the basic information, chemical analysis information and cataloging information of the borehole are sorted out.

The basic information of the borehole can include borehole construction parameters, such as the position coordinates X and Y of the hole, and the elevation H of the hole, and inclinometer parameters, such as the azimuth angle, dip angle and depth of the borehole.

The basic chemical analysis information of the borehole can include the sampling position in the borehole, such as the starting position and the ending position of the sampling, and analysis item names and analysis results.

The cataloging information can include the name of rock and ore, geological description, alteration type and the hidden explosion and crushing degree.

The above basic information can be further filled in and sorted out through the following basic borehole information table (Table 1), basic borehole chemical analysis information table (Table 2), and borehole cataloging information table (Table 3):

TABLE 1

| | | Construction parameter | | | Inclinometer parameters | | |
|---|---|---|---|---|---|---|---|
| | Borehole | | | | | | |
| SN | number | Opening X | Opening Y | Opening H | Azimuth angle | Dip angle | Hole depth |
| 1 | | | | | | | |
| 2 | | | | | | | |
| 3 | | | | | | | |

Basic borehole information table

TABLE 2

Basic borehole chemical analysis information table

| SN | Borehole number | Sample ID | Sampling position from | Sampling position to | Sample section thickness | Analysis item name 1 | Analysis item name 2 | Analysis item name 3 |
|---|---|---|---|---|---|---|---|---|
| 1 | | | | | | | | |
| 2 | | | | | | | | |
| 3 | | | | | | | | |

TABLE 3

Borehole cataloging information table

| SN | Borehole number | Layer number | Hole starting depth | Hole stopping depth | Name of rock and ore | Geological description | Alteration type | Hidden explosion and crushing degree |
|---|---|---|---|---|---|---|---|---|
| 1 | | | | | | | | |
| 2 | | | | | | | | |
| 3 | | | | | | | | |

Step 3 After step 2, based on three standard values of an associated grade, a cut-off grade, and an industrial grade specified in an industrial standard of mineral geological exploration specifications, basic chemical analysis data of the borehole is classified into three grades.

More specifically, the three grades include: grade A: greater than or equal to associated grade and less than cut-off grade, grade B: greater than or equal to cut-off grade and less than industrial grade, and grade C: greater than or equal to industrial grade.

Step 4 A vertical spacing R of the section analysis and a number of sections are determined, and classification parameters of mineralization, hidden explosion, and alteration of the sections are calculated.

More specifically, the step can include the following sub-steps.

(1) A vertical spacing $\overline{H}$ of the section analysis is set, generally preferably 25 m.

(2) According to an elevation H(max) of a maximum opening and an elevation H(min) of a minimum final hole of the borehole and the vertical spacing $\overline{H}$ of the section analysis, the number of the sections is determined as [N]+1, where [ ] represents rounding, and N is calculated as follows:

$$N = \frac{H(\text{max}) - H(\text{min})}{\overline{H}}.$$

According to the borehole cataloging information and the three grades classified in step 3, the mineralization thickness percentage, the thickness percentage of the hidden explosion section, and the thickness percentage of the altered section of borehole grades (grade A or grade B or grade C) of each section are calculated, and the percentage data is classified into several levels from level I to level V from high to low, and filled in the following table.

TABLE 4

Section mineralization, hidden explosion, and alteration classification statistic table

| SN | Project number | Lot number | Mineralization thickness | Mineralization grade (A-C) | Mineralization thickness percentage | Length of hidden explosion section | Thickness percentage of hidden explosion section | Length of altered section | Thickness percentage of altered section |
|---|---|---|---|---|---|---|---|---|---|
| 1 | | | | | | | | | |
| 2 | | | | | | | | | |
| 3 | | | | | | | | | |

Specific parameters are calculated as follows:

mineralization thickness percentage-(mineralization thickness in section/thickness of sample section)× 100%, thickness percentage of hidden explosion section=(length of hidden explosion section within section/thickness of sample section)×100%, and thickness percentage of altered section=(length of altered section within section/thickness of sample section)× 100%.

The classification can be set as follows:

100-80% for level I, 80-60% for level II, 60-40% for level III, 40-10% for level IV, and 10-0% for level V.

Step 5 On the exploration control plane with control point positions, according to the principle of control area of adjacent points sharing a same edge, the map reflecting the zoning of control area of each exploration point is determined, the sectional finite element zoning map is obtained, and values are assigned for each finite element in the zoning map according to the results obtained from sectional quantitative statistics in step 4 to form the sectional finite element plane (hereinafter referred to as the sectional plane).

The step can more specifically include the following sub-steps.

(1) The exploration borehole control points are projected on the sectional planes.

Figure 3:
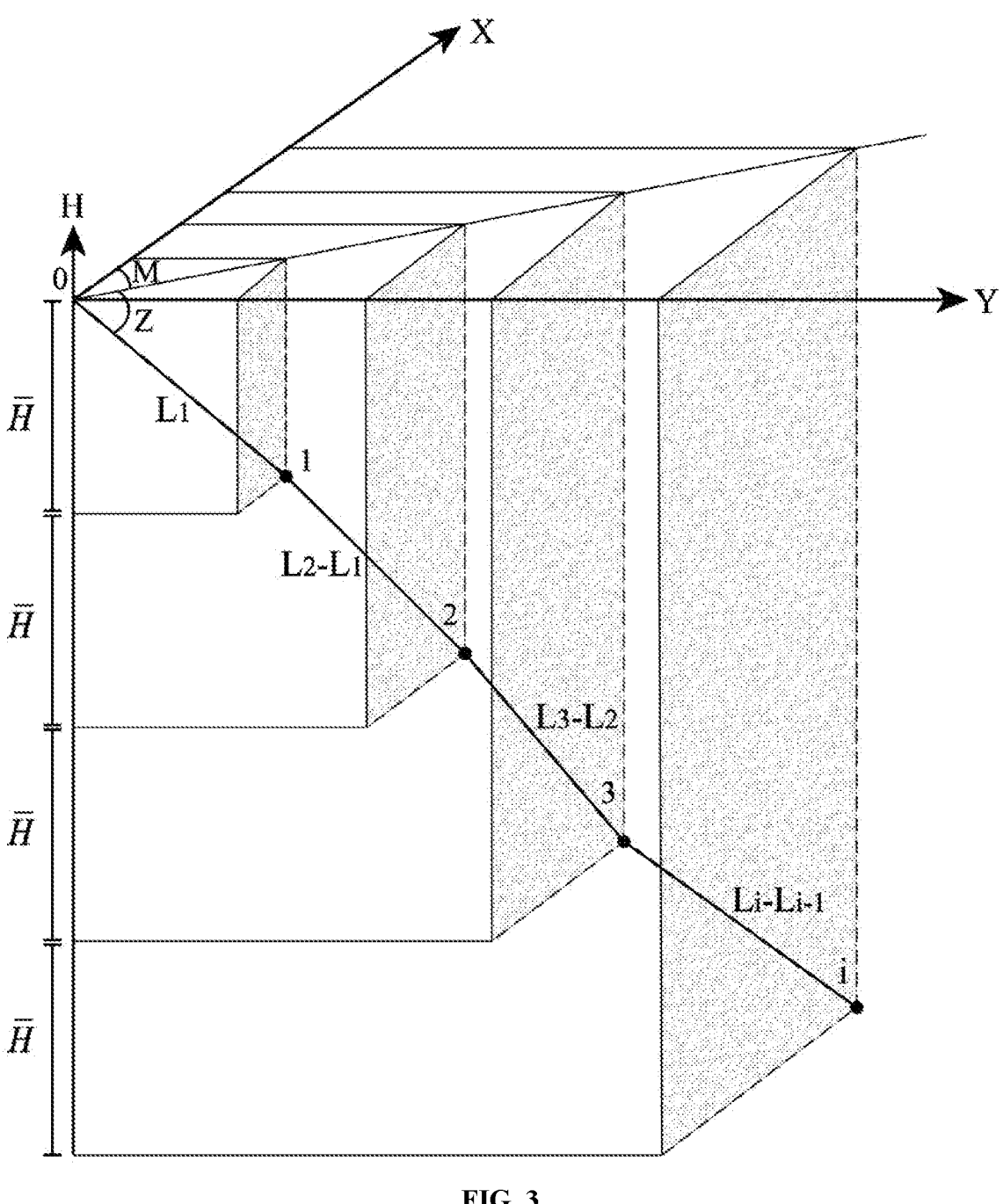
FIG. 3 is a schematic diagram of correcting coordinates of inclined hole control points on a sectional plane by adopting a full-angle half-distance method in step 5 of the specific implementation of the present disclosure.

The exploration borehole drilled downward can be divided into inclined and vertical holes. The control point coordinates Xi and Yi of the vertical borehole on the sectional plane are the opening position coordinates X and Y in step 2. For the control point coordinates of the inclined hole on the sectional plane, according to the different borehole construction parameters, inclinometer parameters and elevation of each sectional plane in step 2, the control point coordinates Xi and Yi on the sectional plane can be corrected and assigned by depth section using the full-angle half-distance method with the opening position coordinates X and Y as the known starting points, as shown in FIG. 3.

The full-angle half-distance method can be more specifically as follows:

$$Xi = X_{i-1} + \frac{L_i - L_{i-1}}{2[\cos Z_{i-1} \times \cos(M_{i-1} + dM) + \cos Z_i \times \cos(M_i + dM)]}, \text{ and}$$

$$Yi = Y_{i-1} + \frac{L_i - L_{i-1}}{2[\cos Z_{i-1} \times \sin(M_{i-1} + dM) + \cos Z_i \times \cos(M_i + dM)]},$$

where Xi and Yi are control point coordinates of the inclined hole on each sectional plane (i=0, 1, 2, ..., N), $L_i$ is a length from the control point on each sectional plane to the opening positions X and Y, $Z_i$ is a dip angle of the control point on each sectional plane, $M_i$ is an azimuth angle of the control point on each sectional plane, and dM is a magnetic declination. $L_i$, $Z_i$, and $M_i$ can be checked in the inclinometer parameters in step 2. dM can be checked in the 1/50,000 topographic map of the borehole area.

(2) Finite extrapolation of outermost control points is performed and an envelope of an extrapolated circle is connected to determine a boundary of the finite element zoning map. The extrapolated spacing can be ½ of an average spacing of mining projects.

(3) According to a principle of adjacent points sharing a same edge, a boundary line of the finite elements is divided along a midpoint between adjacent projects, and the finite elements are divided accordingly to form the sectional finite element zoning map. The minimum scale of the sectional finite element zoning map can generally be 1/25,000.

(4) According to a regional geological structure, a degree of engineering deflection, and distribution of discontinuities, and in combination with a geological expert knowledge base, boundary division of the finite elements are moderately adjusted.

(5) The results in the sectional statistical table are assigned to each finite element class by class to form the sectional finite element plane and corresponding database.

Furthermore, since the division of the finite element in the sectional plane is only related to the position of the borehole control point, and is not affected by other variables, the finite element can contain multiple groups of information. Taking a point Læs on the sectional plane as an example, the structure of the database is described as follows.

For any point $D_m$ inside the finite element, there is:

$$D_m = \{X_m, Y_m, P, \alpha_p, \beta_p, \gamma_p \ldots \}$$

where $X_m$ and $Y_m$ represent plane coordinates of the point, P represents the finite element that the point belongs to on the plane, which can be regarded as a fixed value after the division of the sectional finite element, and $\alpha_p$, $\beta_p$, $\gamma_p$**** represents various to-be-analyzed attributes to which the finite element is assigned.

For any point on a boundary of the finite element, there is:

$$D_m = (X_m, Y_m, H_n, B\}$$

where B represents a boundary point nature of the point, and $H_n$ is an elevation of a section where the point is located.

According to the obtained sectional finite element plane and database, multiple types of geological information can be analyzed and presented separately or comprehensively, for example, the finite element plane of sectional and graded mineralization thickness, the finite element plane of sectional hidden explosion section thickness-alteration mineralization superposition, and the sectional mineralization thickness-hidden explosion section thickness-alteration section thickness superposition finite element plane.

Step 6 The sectional planes of various data are input into the 3D spatial database according to their spatial positions to form a composite database with co-position superposition.

More specifically, taking a point in the n-th section from top to bottom of the 3D spatial database as an example, the structure of the database is illustrated. If the point is located inside a finite element, then:

$$Dm = \{X_m, Y_m, H_n, P, \alpha_p, \beta_p, \gamma_p***\}$$

where $H_n$ is the elevation of a section where the point is located (subject to the midpoint of the vertical spacing of the section), which satisfies:

$$H_n = H(\max) - \overline{H} \times (n-1)$$

where $H(\max) \geq H_n \geq H(\min)$

If the point is located on a boundary of the finite element, there is:

$$D_m = \{X_m, Y_m, H_n, B)$$

Step 7 The corresponding scanning analytic finite element profile (hereinafter referred to as analytic profile) is constructed using geographic information system (GIS) software such as Mapgis.

More specifically, the step can include the following sub-steps.

(1) A parallel vertical profile with a horizontal spacing of £ (generally selected as 25 or 50 m, for example) is arranged for zone line spatial discrimination analysis with the sectional finite element zoning map with co-position superposition in step 6.

(2) When the vertical profile intersects the sectional plane, it is assigned based on the co-position superposition database established in step 6. Taking a vertical profile $L_l(X_l, Y_l, H_l)$ as an example, when it coincides with the point $D_m$ in the n-th section mentioned in step 6, that is, when ($X_l=X_m$, $Y_l=Y_m$, $H_l=H_n$), the coincidence point on the profile is assigned with (P, $\alpha_p$, $\beta_p$, $\gamma_p$) or (B)

(3) Based on boundary points assigned in the previous step (that is, all points assigned with (B)), an intersection line of the vertical profile and the sectional plane is divided. Thereafter, each boundary point on the intersection line is extended by $\frac{1}{2}\mathcal{L}$ upward or downward along the vertical profile, and horizontal sealing is performed to create the finite elements on the profile.

(4) Based on attribute points on the intersection line assigned with (P, $\alpha_p$, $\beta_p$, $\gamma_p$), the profile finite element is assigned, and the analytic profile database is constructed.

Step 8 Superposition analysis of sectional planes or analytic profiles of different types of data is performed using multiple areal spatial analysis and superposition function of GIS software such as Mapgis. A spatial correlation of multiple objects is determined. A potential metallogenic prospect zone is delineated in combination with a development trend of a mineralization grade, a hidden explosion grade, and an alteration grade and a general geological law, and a resource potential of surrounding and deep ore bodies of a mining area is predicted and evaluated.

In the above process, the scanning and analysis of the finite element profile in steps 5 to 7 is shown in FIG. 2.

Embodiment 1

According to the above specific implementations, taking a copper molybdenum deposit as an example, data related to a copper molybdenum deposit as an example, data related to geological borehole is comprehensively collected, and the collected geological borehole data is systematically checked and sorted out. A total of 78 boreholes is drilled in the ore deposit, with a total drill footage of 25,427.72 m. A total of 2,796 basic chemical analysis samples of lead is collected. A total of 13,074.93 m is drilled in the sampling section, accounting for 51.42% of the total drill footage.

In order to finely characterize the single element mineralization classification of Cu and Mo, based on three standard values of an associated grade, a cut-off grade, and an industrial grade specified in an industrial standard of mineral geological exploration specifications, basic chemical analysis data of the two mineralized elements of Cu and Mo in the borehole is divided into three grades from high to low (Table 5).

TABLE 5

| Brief grading of mineralized elements of copper molybdenum ore deposit | | |
| --- | --- | --- |
| Mineralized element | Mineralization grade | Grading standard |
| Cu | Grade A | 0.05%-0.2% |
| | Grade B | 0.2%-1% |
| | Grade C | ≥1% |
| Mo | Grade A | 0.01%-0.03% |
| | Grade B | 0.03%-0.1% |
| | Grade C | ≥0.1% |

Through the processing of borehole engineering parameters and basic analysis data, the vertical spacing of section analysis is determined as 25 m. 78 exploration borehole control points are projected on each sectional plane with a spacing of 25 m. The mineralization classification parameters of different sections are calculated, and the mineralization thickness percentages are divided into level I to level V from high to low (Table 6).

TABLE 6

| Statistic table of sectional mineralization classification of copper molybdenum ore deposit | | | | | |
| --- | --- | --- | --- | --- | --- |
| SN | Sample number | Mineralization thickness (m) | Mineralization grade (A-C) | Mineralization thickness ratio (%) | Mineralization thickness grade |
| 1 | 428 | 818.06 | A | 49.23 | III |
| 2 | 184 | 343.66 | A | 20.68 | IV |
| 3 | 302 | 500.15 | A | 30.10 | IV |
| . . . | . . . | . . . | . . . | . . . | . . . |
| . . . | . . . | . . . | . . . | . . . | . . . |
| . . . | . . . | . . . | . . . | . . . | . . . |

Figure 4:
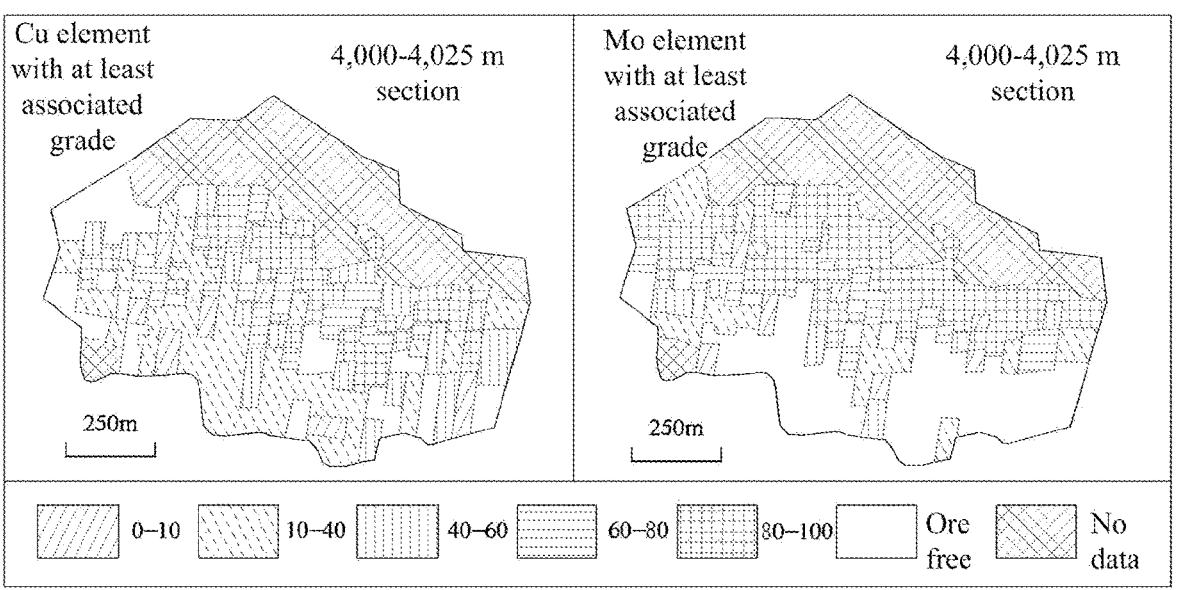
FIG. 4 is a sectional finite element plane of copper and molybdenum mineralization characteristics obtained in a mining area in Embodiment 1 of the present disclosure.

On the exploration control plane with control point positions, according to the principle of control area of adjacent points sharing a same edge, the map reflecting the zoning of control area of each exploration point is determined, the sectional finite element zoning map is obtained, and values are assigned for each finite element in the zoning map according to the results obtained from sectional statistics to obtain the grade A mineralization sectional plane of Cu and Mo elements as shown in FIG. 4.

The sectional planes of various data are input into the 3D spatial database according to their spatial positions to form a composite database with co-position superposition. The analytical profiles of grade A mineralization of Cu and Mo elements shown in FIG. 5 and FIG. 6 are obtained using GIS software such as Mapgis.

Superposition analysis of sectional planes or analytic profiles is performed using multiple areal spatial analysis and superposition function of GIS software such as Mapgis.

The sectional plane of FIG. 4 shows that the planar shape of the middle section of the ore body is mostly star shaped, reticulated, banded and agglomerated, the mineralization thickness grade of the Cu and Mo elements is random, the mineralization in the middle becomes reticulated and agglomerated, the southern boundary is gradually dispersed, and part of the ore body is wrapped in ore free units. In general, the hierarchical mineralization planar shape of the Cu and Mo elements is diverse, reflecting the participation of multiple stages and types of hydrothermal solution in mineralization.

Figure 5:
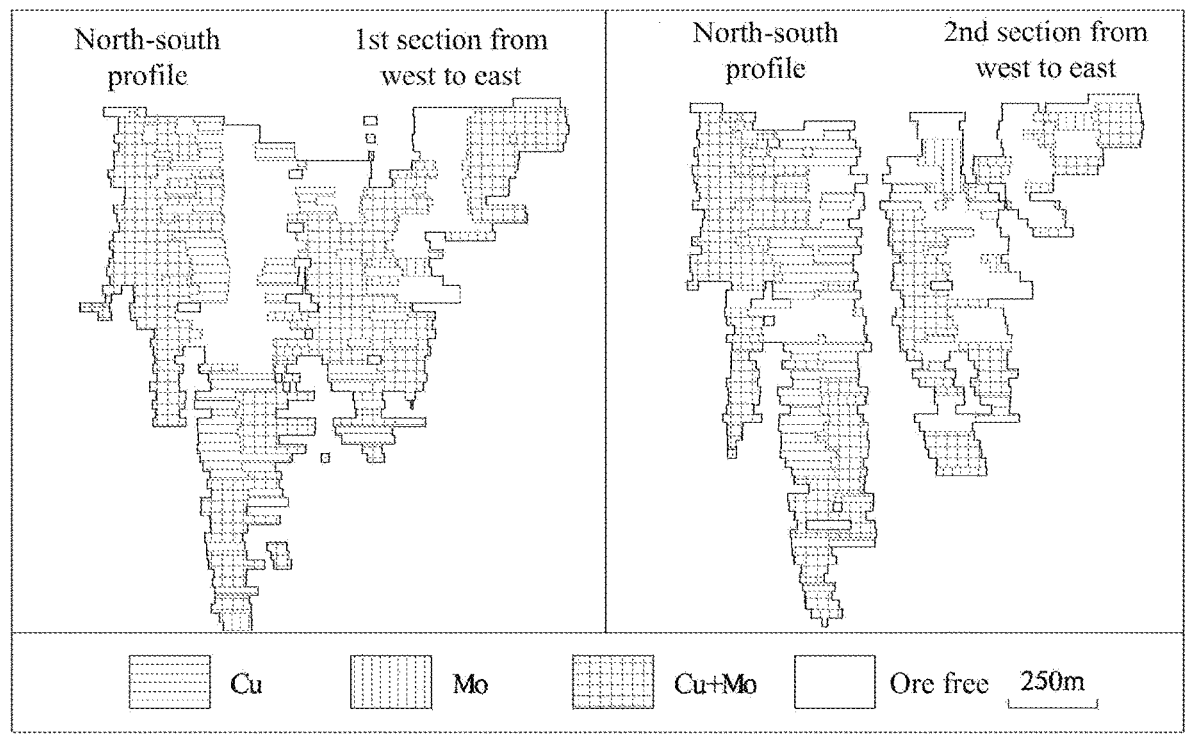
FIG. 5 is a scanning analytical finite element profile in a north-south direction of the copper and molybdenum mineralization characteristics obtained in the mining area in Embodiment 1 of the present disclosure.
Figure 6:
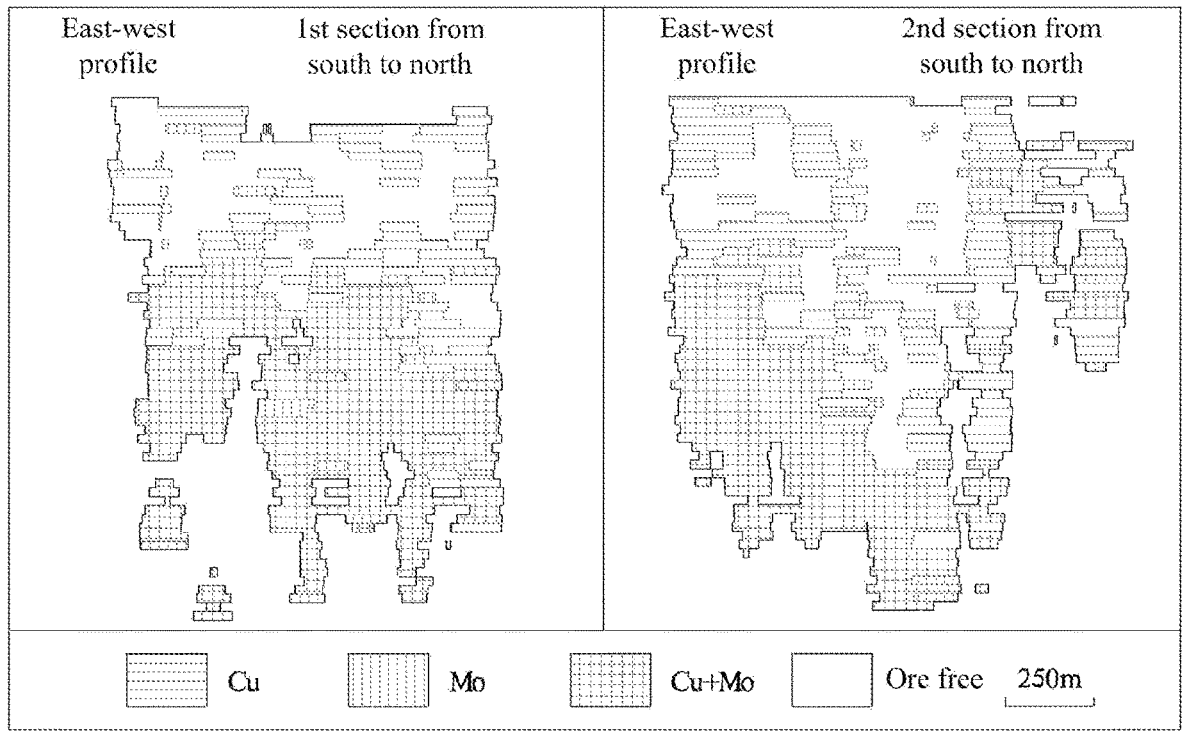
FIG. 6 is a scanning analytical finite element profile in an east-west direction of the copper and molybdenum mineralization characteristics obtained in the mining area in Embodiment 1 of the present disclosure.

The analytic profiles of FIG. 5 and FIG. 6 show that in the north-south profile, the ore body from west to east is forked or fusiform, and the vertical mineralization changes from banded to agglomerated to gridded. In the east-west profile, the copper molybdenum mineralization of the ore deposit presents obvious comb and network shape in the south. From the south to the north, the scale of the mineralized body gradually decreases. The mineralization in the south and west is better than that in the north and east. The shape also gradually becomes a ladder shape with small scale, reflecting the horizontal hydrothermal superposition or infiltration. It can be seen that in the vertical direction, the mineralization is more concentrated, wider in scope and stronger in depth.

The above embodiments merely describe preferred implementations of the present disclosure, and the scope of protection of the present disclosure is not limited to the above embodiments. All technical solutions under the idea of the present disclosure belong to the scope of protection of the present disclosure. It should be noted that those of ordinary skill in the art can make several improvements and modifications without departing from the principles of the present disclosure. These improvements and modifications should also be considered as falling within the scope of protection of the present disclosure.

What is claimed:

1. A finite element-based ore deposit drilling information processing method, the method is performed by an ore deposit drilling information analysis device, comprising a storage medium and an arithmetic unit (ALU), wherein when the ALU executes program and/or structural data stored on the storage medium, the ALU is configured to perform following operations, comprising:

obtaining borehole information, sampled sample information, and geological information corresponding to a borehole of a to-be-analyzed ore deposit, wherein the sampled sample information comprises position information and chemical analysis information of samples sampled through the borehole;

based on three standard values of an associated grade, a cut-off grade, and an industrial grade specified in an industrial standard of mineral geological exploration specifications, performing grade classification of ore deposits corresponding to the samples at different positions according to the sampled sample information;

according to the borehole information, the sampled sample information, and the geological information corresponding to the borehole, performing vertical section analysis of the to-be-analyzed ore deposit, wherein the vertical section analysis comprises: determining a vertical spacing of vertical sections and number of the vertical sections, calculating mineralization, hidden explosion, and alteration parameters of each of the sections, and classifying the calculated parameters;

obtaining a horizontal plane projection map of exploration borehole control points in different vertical sections, and performing map zoning according to a control range of each exploration point to form a sectional finite element zoning map;

according to results of the vertical section analysis, assigning different parameters to each finite element in the sectional finite element zoning map of different vertical sections to form a sectional finite element plane of each parameter;

performing three-dimensional (3D) superposition on the sectional finite element plane of each parameter according to spatial positions, and during the superposition, combining parameters at a same position to obtain a 3D composite data graph;

scanning and analyzing the 3D composite data graph on a vertical profile to obtain a corresponding finite element profile containing composite data;

performing superposition analysis on the sectional finite element plane and/or the corresponding finite element profile; and determining a spatial correlation of multiple objects according to results of the superposition analysis, and delineating a potential metallogenic prospect zone in combination with a development trend of a mineralization grade, a hidden explosion grade, and an alteration grade, and a geological law to predict and evaluate a resource potential of surrounding and deep ore bodies of a mining area;

wherein a process of obtaining the sectional finite element zoning map specifically comprises:

in any vertical section, projecting the exploration borehole control points on the plane;

performing finite extrapolation of outermost control points and connecting an envelope of an extrapolated circle to determine a boundary of the finite element zoning map;

according to a principle of adjacent points sharing a same edge, dividing a boundary line of the finite elements along a midpoint between adjacent projects, and dividing the finite elements accordingly to form the sectional finite element zoning map;

according to a regional geological structure, a degree of engineering deflection, and distribution of discontinuities, and in combination with a geological expert knowledge base, adjusting boundary division of the finite elements; and assigning the results of the vertical section analysis to each finite element class by class to form the sectional finite element plane of each parameter, wherein an extrapolated spacing is ½ of an average spacing of mining projects;

wherein in the sectional finite element plane, data compositions at different points are as follows:

for any point $D_m$, if the point is located in the finite element, there is:

$$D_m = \{X_m, Y_m, P, \alpha_p, \beta_p, \gamma_p \ldots\}; \text{ and}$$

if the point is located on a boundary of the finite element, there is:

$$D_m = \{X_m, Y_m, H_m, B\}$$

wherein $X_m$ and $Y_m$ represent plane coordinates of the point, P represents the finite element that the point belongs to on the plane, $\alpha_p$, $\beta_p$, $\gamma_p$ . . . represents various to-be-analyzed attributes to which the finite element is assigned, B represents a boundary point nature of the point, and $H_n$ represents an elevation of a section where the point is located;

wherein a process of obtaining the finite element profile containing composite data specifically comprises:

on each horizontal plane of the 3D composite data graph, arranging a parallel vertical profile with a horizontal spacing of $\mathcal{L}$ for zone line spatial discrimination analysis with the sectional finite element zoning map;

when the vertical profile intersects a sectional plane of the sectional finite element zoning map, assigning an intersection point according to the combination of the parameters at the same position;

based on boundary points assigned in the sectional finite element plane, dividing an intersection line of the vertical profile and the sectional plane, extending each boundary point on the intersection line by ½ $\mathcal{L}$ upward or downward along the vertical profile, and performing horizontal sealing to create the finite elements on the profile; and based on attribute points on the intersection line assigned with (P, $\alpha_p$, $\beta_p$, $\gamma_p$), assigning the profile finite element, and constructing the analytic finite element profile and a corresponding database for the analytic finite element profile.

2. The information processing method according to claim 1, wherein the borehole information comprises position coordinates, an elevation, an azimuth angle, a dip angle and a depth of the borehole; and/or, the sampled sample information comprises starting position coordinates of sampling, ending position coordinates of sampling, and chemical analysis items and chemical analysis result data of the samples; and/or, the geological information comprises a name of rock and ore corresponding to the borehole, geological description, an alteration type, and a hidden explosion and crushing degree.

3. The information processing method according to claim 1, wherein the grades comprise: grade A: greater than or equal to associated grade and less than cut-off grade; grade B: greater than or equal to cut-off grade and less than industrial grade; and grade C: greater than or equal to industrial grade.

4. The information processing method according to claim 1, wherein the vertical section analysis specifically comprises:

setting a vertical spacing $\overline{H}$ of the section analysis;

according to the borehole information, obtaining an elevation H(max) of a maximum opening and an elevation H(min) of a minimum final hole of the borehole, and determining a number of the sections [N]+1 in combination with the vertical spacing, wherein [ ] represents rounding, and N is calculated as follows:

$$N = \frac{H(\max) - H(\min)}{\overline{H}};$$

and according to the geological information corresponding to the borehole, calculating a mineralization thickness percentage parameter, a thickness percentage parameter of a hidden explosion section, and a thickness percentage parameter of an altered section of the boreholes in each vertical section with different grades, and classifying the percentage parameters into several levels from high to low, wherein the percentage parameters are calculated as follows:

mineralization thickness percentage-(mineralization thickness in vertical section/thickness of sample section)×100%;

thickness percentage of hidden explosion section-(length of hidden explosion section in vertical section/thickness of sample section)×100%; and thickness percentage of altered section-(length of altered section in vertical section/thickness of sample section)×100%.

5. The information processing method according to claim 4, wherein the vertical spacing $\overline{H}$ is 20-25 m; and/or, the levels comprise the following five levels: 100-80% for level I, 80-60% for level II, 60-40% for level III, 40-10% for level IV, and 10-0% for level V.

6. An ore deposit drilling information analysis device, comprising a storage medium and an arithmetic unit (ALU), wherein the storage medium stores program and/or structural data for implementing the information processing method according to claim 1.

7. The ore deposit drilling information analysis device according to claim 6, wherein the borehole information comprises position coordinates, an elevation, an azimuth angle, a dip angle and a depth of the borehole; and/or, the sampled sample information comprises starting position coordinates of sampling, ending position coordinates of sampling, and chemical analysis items and chemical analysis result data of the samples; and/or, the geological information comprises a name of rock and ore corresponding to the borehole, geological description, an alteration type, and a hidden explosion and crushing degree.

8. The ore deposit drilling information analysis device according to claim 6, wherein the grades comprise: grade A: greater than or equal to associated grade and less than cut-off grade; grade B: greater than or equal to cut-off grade and less than industrial grade; and grade C: greater than or equal to industrial grade.

9. The ore deposit drilling information analysis device according to claim 6, wherein the vertical section analysis specifically comprises:

setting a vertical spacing $\overline{H}$ of the section analysis;

according to the borehole information, obtaining an elevation H(max) of a maximum opening and an elevation H(min) of a minimum final hole of the borehole, and determining a number of the sections [N]+1 in combination with the vertical spacing $\overline{H}$, wherein [ ] represents rounding, and N is calculated as follows:

$$N = \frac{H(\max) - H(\min)}{\overline{H}};$$

and according to the geological information corresponding to the borehole, calculating a mineralization thickness percentage parameter, a thickness percentage parameter of a hidden explosion section, and a thickness percentage parameter of an altered section of the boreholes in each vertical section with different grades, and classifying the percentage parameters into several levels from high to low, wherein the percentage parameters are calculated as follows:

mineralization thickness percentage-(mineralization thickness in vertical section/thickness of sample section)×100%;

thickness percentage of hidden explosion section-(length of hidden explosion section in vertical section/thickness of sample section)×100%; and thickness percentage of altered section=(length of altered section in vertical section/thickness of sample section)×100%.

* * * * *